US008003418B2

(12) United States Patent
Umemura et al.

(10) Patent No.: US 8,003,418 B2
(45) Date of Patent: Aug. 23, 2011

(54) METHOD FOR PRODUCING GROUP III NITRIDE-BASED COMPOUND SEMICONDUCTOR DEVICE

(75) Inventors: Toshiya Umemura, Aichi-ken (JP); Ryohei Inazawa, Aichi-ken (JP); Koichi Goshonoo, Aichi-ken (JP); Tomoharu Shiraki, Aichi-ken (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 12/662,067

(22) Filed: Mar. 30, 2010

(65) Prior Publication Data
US 2010/0248407 A1    Sep. 30, 2010

(30) Foreign Application Priority Data

Mar. 31, 2009 (JP) ................. 2009-085438
Jun. 29, 2009 (JP) ................. 2009-153227
Sep. 12, 2009 (JP) ................. 2009-211160

(51) Int. Cl.
*H01L 21/00* (2006.01)

(52) U.S. Cl. ............... 438/29; 438/28; 438/32; 438/38; 438/42; 438/46; 438/456; 438/458; 438/459

(58) Field of Classification Search ............. 438/28, 438/29, 32, 38, 42, 46, 456, 458, 459
See application file for complete search history.

(56) References Cited

U.S. PATENT DOCUMENTS

| | | | | |
|---|---|---|---|---|
| 7,105,857 B2 * | 9/2006 | Nagahama et al. | ............ | 257/86 |
| 7,582,908 B2 | 9/2009 | Kanamoto et al. | | |
| 7,781,242 B1 * | 8/2010 | Chen et al. | ............ | 438/29 |
| 7,829,909 B2 * | 11/2010 | Yoo | ............ | 257/99 |
| 2006/0105542 A1 * | 5/2006 | Yoo | ............ | 438/455 |
| 2008/0023799 A1 | 1/2008 | Kanamoto et al. | | |
| 2009/0278233 A1 * | 11/2009 | Pinnington et al. | ............ | 257/615 |
| 2010/0117115 A1 * | 5/2010 | Tanaka et al. | ............ | 257/103 |
| 2010/0196683 A1 * | 8/2010 | Haskal | ............ | 428/212 |
| 2010/0203661 A1 * | 8/2010 | Hodota | ............ | 438/29 |
| 2010/0264440 A1 * | 10/2010 | Park | ............ | 257/98 |

FOREIGN PATENT DOCUMENTS

| | | |
|---|---|---|
| JP | 2007-273492 | 10/2007 |
| JP | 2008-28291 | 2/2008 |

OTHER PUBLICATIONS

Kelly, et al., "Optical Patterning of GaN Films", Appl. Phys. Lett., vol. 69, 1996, pp. 1749-1751.

* cited by examiner

*Primary Examiner* — Kevin M Picardat
*Assistant Examiner* — Bac H Au
(74) *Attorney, Agent, or Firm* — McGinn IP Law Group, PLLC

(57) ABSTRACT

Provided is a method for producing a Group III nitride-based compound semiconductor light-emitting device, wherein a contact electrode is formed on an N-polar surface of an n-type layer through annealing at 350° C. or lower. In the case where, in a Group III nitride-based compound semiconductor device produced by the laser lift-off process, a contact electrode is formed, through annealing at 350° C. or lower, on a micro embossment surface (i.e., a processed N-polar surface) of an n-type layer from vanadium, chromium, tungsten, nickel, platinum, niobium, or iron, when a pseudo-silicon-heavily-doped layer is formed on the micro embossment surface (i.e., N-polar surface) of the n-type layer through treatment with a plasma of a silicon-containing compound gas, and treatment with a fluoride-ion-containing chemical is not carried out, ohmic contact is obtained, and low resistance is attained.

8 Claims, 12 Drawing Sheets

METHOD FOR PRODUCING GROUP III NITRIDE-BASED COMPOUND SEMICONDUCTOR DEVICE

BACKGROUND OF THE INVENTION

1. Field of the Invention

The present invention relates to a method for producing a Group III nitride-based compound semiconductor device. More particularly, the present invention relates to a method for producing a Group III nitride-based compound semiconductor device employing the so-called laser lift-off technique, in which a Group III nitride-based compound semiconductor is epitaxially grown on a substrate made of a material different from Group III nitride-based compound semiconductor (hereinafter the substrate may be referred to as a "hetero-substrate") to form a device structure; a conductive support substrate is bonded, via a conductive layer (e.g., a metal layer or a solder layer), to the uppermost layer of the device structure; and the hetero-substrate is removed by decomposing, through laser irradiation, a Group III nitride-based compound semiconductor thin layer in the vicinity of the interface between the Group III nitride-based compound semiconductor and the hetero-substrate. The present invention is particularly effective for a method for producing a Group III nitride-based compound semiconductor light-emitting device in which an electrode of low contact resistance is formed on an N (nitrogen)-polar surface of an n-type layer that, together with a p-type layer, sandwiches a pn junction structure or an active layer.

2. Background Art

With the laser lift-off technique developed by Kelly, et al. (described in Appl. Phys. Lett., vol. 69, 1996, pp. 1749-1751), in a Group III nitride-based compound semiconductor device (e.g., a light-emitting device), the substrate used for epitaxial growth of a Group III nitride-based compound semiconductor can be replaced with a conductive support substrate. This technique realizes, for example, formation of an electrode on the bottom surface of a support substrate of a light-emitting diode. Also, this technique realizes production of a light-emitting device having facing opposite electrodes (i.e., positive and negative electrodes) on both the bottom surface of a substrate and the uppermost surface of an epitaxial layer, similar to the case of a GaAs light-emitting device.

Provision of positive and negative electrodes in such a manner that they face each other via a light-emitting layer sandwiched therebetween is advantageous in that the area of a light-emitting region can be regulated to be approximately equal to the horizontal area of a support substrate, and that light extraction performance per unit device can be improved by virtue of attainment of light emission having uniform intensity. Prior art of the present invention is described in Japanese Patent Application Laid-Open (kokai) Nos. 2007-273492 and 2008-028291.

In the laser lift-off technique, when, for example, a structure including a sapphire substrate is irradiated with a laser beam having an appropriate wavelength, an aluminum nitride buffer provided on the substrate, and a gallium nitride layer formed on the buffer, GaN at the interface between the substrate and the gallium nitride layer is decomposed into molten metal gallium (Ga) and nitrogen ($N_2$) gas; i.e., GaN at the interface between the GaN layer and the substrate is melted in the form of thin film. When, for example, a Group III nitride-based compound semiconductor is epitaxially grown through metal organic vapor phase epitaxy (MOVPE), the growth surface of the semiconductor is a so-called Ga-polar surface. Therefore, the surface of the aforementioned GaN layer exposed through the laser lift-off process is an N-polar surface. That is, when an n-electrode is formed on the GaN layer exposed through the laser lift-off process, the surface on which the n-electrode is formed is the N-polar surface of the GaN layer.

As has been well known, when an electrode is formed on a Group III nitride-based compound semiconductor layer (in particular, a gallium nitride (GaN) layer), ohmic contact is easily attained at a Ga-polar surface, but is difficult to attain at an N-polar surface. This phenomenon is theorized that nitrogen vacancies serve as pseudo-donors at the Ga-polar surface, and contact resistance between the Ga-polar surface and a metal which is in contact therewith is reduced, whereas virtually no nitrogen vacancies are present at the N-polar surface, and no reduction in contact resistance is expected at the N-polar surface.

When a Group III nitride-based compound semiconductor device is produced by bonding a conductive substrate (support substrate) to a p-electrode via a low-melting-point alloy layer (e.g., a solder layer) through the laser lift-off process, the following problems arise upon formation of an n-electrode.

First, since the low-melting-point alloy layer (e.g., solder layer) has been already used for bonding of the support substrate to the p-electrode, when, for example, formation of the n-electrode requires thermal treatment, heating to a temperature exceeding 400° C. cannot be carried out. Therefore, a material which requires annealing (i.e., thermal treatment) cannot be used for forming the n-electrode.

Specifically, thermal treatment at 350° C. to 400° C. after formation of the solder layer causes, for example, the following problem: when the solder layer is formed of a tin (Sn)-containing solder, tin (Sn) may be dispersed in a p-GaN layer or the support substrate made of silicon, and contact resistance may be increased between the p-GaN layer or support substrate and a metal layer formed thereon. Therefore, a material which requires thermal treatment at 500 to 550° C. cannot be used for forming an n-electrode of a Group III nitride-based compound semiconductor device produced through the laser lift-off process.

Second, in the case where a Group III nitride-based compound semiconductor device is produced by using, as an electrode material, a metal (e.g., tantalum (Ta)) which realizes low contact resistance between the electrode and an n-GaN layer without requiring thermal treatment, when the thus-produced semiconductor device is subjected to thermal treatment (e.g., at 250 to 300° C. for several minutes) by, for example, a user thereof, the contact resistance may be increased. Therefore, such an electrode material is not desired for forming an n-electrode of a Group III nitride-based compound semiconductor device produced through the laser lift-off process.

SUMMARY OF THE INVENTION

In order to solve the aforementioned problems, an object of the present invention is to provide a method for forming an n-electrode of a Group III nitride-based compound semiconductor device produced through the laser lift-off process.

In a first aspect of the present invention, there is provided a method for producing a Group III nitride-based compound semiconductor light-emitting device, the method comprising:

a layer stacking step of forming an n-type layer, a light-emitting layer, and a p-type layer sequentially on an epitaxial growth substrate formed of a hetero-substrate;

a bonding step of forming a conductive layer on a surface of the p-type layer, to thereby bond the p-type layer to a conductive support substrate;

a growth substrate removal step of removing the epitaxial growth substrate by decomposing at least a portion of the n-type layer through laser irradiation; and a pretreatment and electrode formation step of forming an electrode on the thus-exposed n-type layer, wherein the pretreatment and electrode formation step comprises:

a plasma silicon doping step of doping a surface of the n-type layer with silicon by applying, to the n-type layer surface, a plasma of a silicon-containing compound formed through application of high-frequency electric power to the conductive substrate;

a contact electrode formation step of forming, on the n-type layer surface, a contact electrode comprising at least one selected from a group consisting of vanadium, chromium, tungsten, nickel, platinum, niobium, and iron; and an alloying step of alloying the n-type layer and the contact electrode through thermal treatment at 100° C. to 350° C.

The plasma silicon doping step means additionally doping a surface of the n-type layer with silicon because the n-type layer is already doped with silicon in the epitaxial growth.

A second aspect of the present invention is a partial modification of the first aspect of the present invention. Specifically, the second aspect is identical with the first aspect, except that an undoped layer is formed on an epitaxial growth substrate formed of a hetero-substrate before formation of an n-type layer; that the epitaxial growth substrate is removed by decomposing at least a portion of the undoped layer through laser irradiation; and that an undoped layer removal step is carried out before the pretreatment and electrode formation step for removing the undoped layer to thereby expose the n-type layer. The undoped layer removal step is preferably carried out through wet etching or dry etching. However, the undoped layer removal step may be carried out through any known technique.

A third aspect of the present invention is drawn to a specific embodiment of the production method according to the first or second aspect, wherein treatment with a solution of a fluorine-containing compound is not carried out between the plasma silicon doping step and the contact electrode formation step.

A fourth aspect of the present invention is drawn to a specific embodiment of the production method according to any one of the first to third aspects, which further comprises an embossment formation step of forming an embossment on a surface of the exposed n-type layer before the pretreatment and electrode formation step.

A characteristic feature of the present invention resides in that an n-type Group III nitride-based compound semiconductor layer is treated with a plasma of an Si-containing compound gas, to thereby form a thin, pseudo-Si-heavily-doped layer on an N-polar surface of the semiconductor layer. This treatment realizes ohmic contact between the N-polar surface and a contact electrode comprising at least one selected from a group consisting of vanadium, chromium, tungsten, nickel, platinum, niobium, and iron without annealing at a high temperature of 500° C. or higher. The electrode can achieve low contact resistance and is useful as an n-electrode.

It is not preferred that, for example, treatment with buffered hydrofluoric acid (BHF) is carried out for the purpose of removing an oxide film on the surface of the pseudo-Si-heavily-doped layer. This is because doped Si is removed from the pseudo-Si-heavily-doped layer by fluoride ions. Thus, treatment with an HF-containing compound (in particular, BHF) is not preferred.

When a contact electrode is formed through sputtering, preferably, low power is employed at an early stage of formation of the electrode. This is because when high power is employed at an early stage of formation of the electrode, the pseudo-Si-heavily-doped layer is damaged by impact of high-energy particles contained in the plasma. Thus, at an early stage, the electrode is preferably formed at low power and low rate.

When high-frequency electric power is applied to a conductive support substrate, Si-containing ions generated in the plasma can be accelerated and caused to impact the surface of the n-type layer, and thus pseudo-Si-heavy-doping can be effectively attained.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
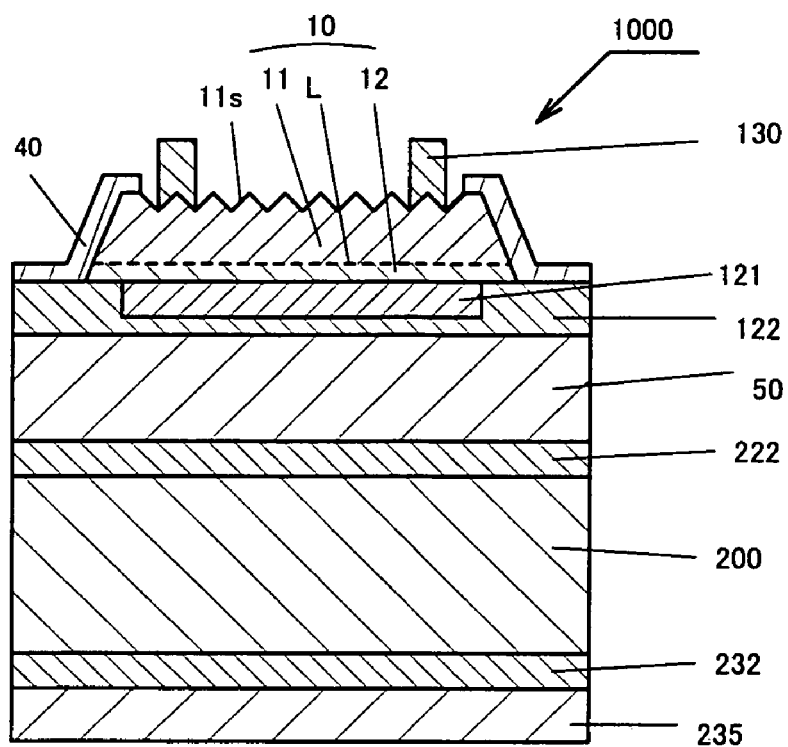
FIG. 1 is a cross-sectional view of the configuration of a Group III nitride-based compound semiconductor device (blue LED) produced through the production method of the present invention.

The present invention may be carried out by means of a generally used plasma generation apparatus. In the present invention, effectively, negative bias voltage is applied to a conductive support substrate.

The silicon-containing gas employed in the present invention may be, for example, $SiCl_4$, $SiHCl_3$, or $SiH_4$. A plasma of a silicon-containing compound gas may be formed by use of any available silicon compound.

No particular limitation is imposed on the method for forming a contact electrode comprising at least one selected from a group consisting of vanadium, chromium, tungsten, nickel, platinum, niobium, and iron, and the contact electrode may be formed through, for example, sputtering or vacuum evaporation. The thickness of the contact electrode is regulated to 10 nm to 5 µm. When a thick contact electrode formed of, for example, gold is stacked, the thickness of the contact electrode is more preferably regulated to 20 nm to 1 µm, much more preferably 50 nm to 500 nm.

In the present invention, pseudo-silicon heavy doping realizes annealing (thermal treatment) of the contact electrode at a low temperature of 350° C. or lower. This thermal treatment may be carried out at, for example, about a temperature equal to or lower than the temperature at which a solder layer is heated upon bonding of a conductive support substrate, via the solder layer, to an epitaxial layer formed on an epitaxial growth substrate before the laser lift-off process.

The present invention may employ, as an epitaxial growth substrate or conductive support substrate, a relatively thick substrate having a thickness of about 500 μm, which facilitates handling. When the resultant wafer is finally separated into individual device chips through, for example, laser cutting, preferably, the thickness of the support substrate is reduced to 100 μm to 200 μm, and then an electrode layer is formed on the bottom surface of the substrate.

Upon the laser lift-off process, preferably, a laser irradiation region (shot area) is determined so that the outer circumference of the laser irradiation region (shot area) is not present in the inner region of each device chip to be finally produced. This is because, when the outer circumference of the laser irradiation region (shot area)—which corresponds to the boundary between a region at which a Group III nitride-based compound semiconductor layer (epitaxial layer) decomposes and a region at which the epitaxial layer does not decompose in the vicinity of the interface between the epitaxial layer and the epitaxial growth substrate; i.e., the boundary between a region at which the epitaxial layer is not bonded to the epitaxial growth substrate and a region at which the epitaxial layer is still bonded to the epitaxial growth substrate—comes across each device chip, stress breakage may occur in the chip to no small extent.

When each device chip has, for example, a square form as viewed from above, the size of the laser irradiation region (shot area) is regulated so that the size thereof is equal to that of the chip, or to that of a rectangular region corresponding to a plurality of device chips. In any case, the laser irradiation region (shot area) is determined so that the outer circumference thereof is present on a line for finally separating the wafer into individual chips.

A first trench formed in Example 1 described hereinbelow must approximately coincide with the outer circumference of each laser irradiation region (shot area). Preferably, there is not a portion of the outer circumference of each laser irradiation region (shot area) at which no first trench is formed.

The first trench may optionally be provided so as to come across an inner portion of each laser irradiation region (shot area). This is of significance when a plurality of device chips are collectively separated from the epitaxial growth substrate at each laser irradiation region (shot area).

Preferably, the first trench communicates with the outside of the wafer. For example, even when the first trench is provided at a region which is in the vicinity of the outer periphery of the epitaxial growth substrate and on which no device chip is formed, preferably, the first trench is formed so as to reach the outer periphery of the epitaxial growth substrate.

Preferably, side surfaces of the first trench are finally removed. When side surfaces of the first trench are finally removed, upon or after formation of the first trench, short circuit may occur between a p-type layer and an n-type layer (i.e., epitaxial layers) which form the side surfaces of the first trench. This is because, since a short-circuit bridge is finally removed, short circuit at the pn junction is prevented in each device chip. Therefore, the process of forming the first trench may employ any of a very wide range of techniques. For example, the process of forming the first trench may be carried out through dicing (by means of a dicer), dry etching (by use of a mask), melting or decomposition (by laser irradiation), or etching (by sandblasting).

In Example 1 described hereinbelow, a second trench is formed so that the wafer formed of epitaxial layers can be separated into individual device chips. In the process of forming the second trench, occurrence of, for example, short circuit between a p-type layer and an n-type layer at peripheral side surfaces of epitaxial layers is not preferred. Therefore, the process of forming the second trench may employ any of a somewhat narrow range of techniques. Dry etching is preferably performed.

Upon formation of the second trench, a portion of epitaxial layers that forms side surfaces of the first trench may be removed, or a portion of epitaxial layers between the first trench and the outer peripheral portion of each device chip may be removed, with a portion of epitaxial layers that forms side surfaces of the first trench being left. When a portion of epitaxial layers that forms side surfaces of the first trench is left in the process of forming the second trench, the epitaxial layer portion may be removed in the process of cutting the support substrate.

The process of cutting the support substrate may employ any cutting technique. In this case, there may occur scattering or deposition of, for example, small pieces of a conductive layer (e.g., a metal layer) or the conductive support substrate. Therefore, it is important that an insulating protective film is formed after formation of the second trench so as to prevent short circuit between a p-type layer and an n-type layer in the process of cutting the support substrate.

Cutting of the support substrate may employ any of a very wide range of techniques. Preferably, combination of half cutting (by means of, for example, a dicer) and mechanical cutting, or decomposition through laser irradiation is employed.

EXAMPLES

Example 1

FIG. 1 is a cross-sectional view of the configuration of a Group III nitride-based compound semiconductor device (blue LED) 1000 produced through a production method according to a specific embodiment of the present invention.

The Group III nitride-based compound semiconductor device (blue LED) 1000 shown in FIG. 1 has a layered structure including a conductive support substrate (p-type silicon substrate) 200, on which the following elements are sequentially provided: a conductive layer 222 formed of a plurality of stacked metal layers; a solder layer 50 (i.e., a low-melting-point alloy layer); a conductive layer 122 formed of a plurality of stacked metal layers; a p-contact electrode 121; a p-type layer 12 formed generally of a single layer or a plurality layers of a p-type Group III nitride-based compound semiconductor; a light-emitting region L; an n-type layer 11 formed generally of a single layer or a plurality layers of an n-type Group III nitride-based compound semiconductor; and an n-contact electrode 130.

In the configuration described in Example 1, the conductive layer 222, the solder layer 50, the conductive layer 122, and the p-contact electrode 121 correspond to the "conductive layer" described in claims.

The peripheral side surfaces of the p-type layer 12 and the n-type layer 11 between which the light-emitting region L is provided are covered with an insulating protective film 40. The horizontal cross-sectional area of the p-type layer 12 and the n-type layer 11 (hereinafter, these layers may be collectively referred to as "epitaxial layer 10") is gradually reduced from the side of the p-type layer 12 facing the support substrate 200 toward the side of the n-type layer 11 facing the n-contact electrode 130. That is, the peripheral side surfaces of the epitaxial layer covered with the insulating protective film 40 are inclined such that the epitaxial layer is tapered from the bottom surface facing the support substrate 200 toward the top surface on which the n-contact electrode 130 is formed.

A surface having a micro embossment (hereinafter may be referred to as "micro embossment surface") 11s is formed on the n-type layer 11 for improving light extraction performance.

A conductive layer 232 including a plurality of stacked metal layers and a solder layer 235 are sequentially formed on the bottom surface of the support substrate 200.

In Example 1, the respective layers have the following structures.

The conductive layer 222 is formed so that a titanium (Ti) layer, a nickel (Ni) layer, and a gold (Au) layer are sequentially provided on the support substrate 200. The conductive layer 232 is formed so that a platinum (Pt) layer, a titanium (Ti) layer, and a gold (Au) layer are sequentially provided on the support substrate 200.

Each of the solder layers 50 and 235 is formed from a solder of gold-tin (Au—Sn) alloy.

The p-contact electrode 121 is formed from a silver (Ag) alloy.

The conductive layer 122 is formed so that a titanium (Ti) layer, a titanium nitride (TiN) layer, a titanium (Ti) layer, a nickel (Ni) layer, and a gold (Au) layer are sequentially provided on the p-type layer 12 (or the p-contact electrode 121).

In the conductive layers 222, 232, and 122, the nickel (Ni) layer is provided for preventing diffusion of tin (Sn) contained in the solder layer 50 or 235, and the titanium (Ti) layer is provided for improving adhesion of the conductive layer at a bonding surface.

The n-contact electrode 130 is formed of a layered structure of a vanadium (V) layer and a gold (Au) layer.

The insulating protective film 40 is formed from silicon nitride ($SiN_x$).

Figure 2A:
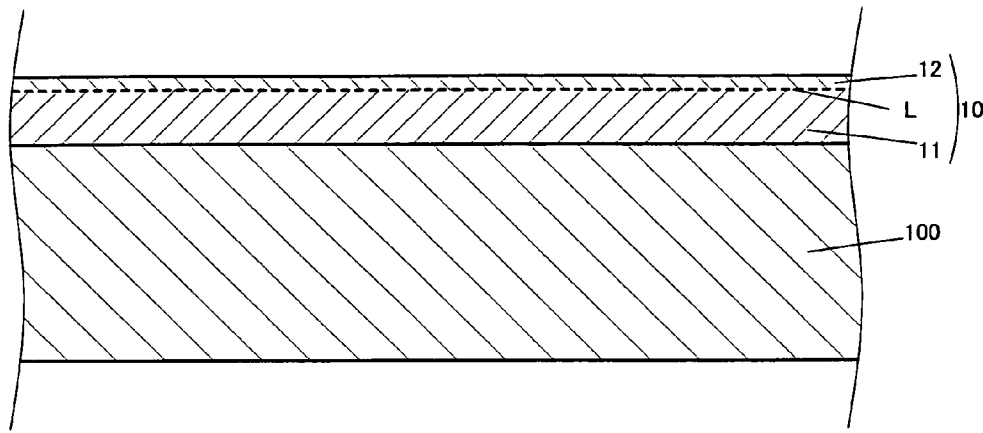
FIGS. 2A to 2P are sketches showing processes of the production method of the present invention (cross-sectional views)
Figure 2B:
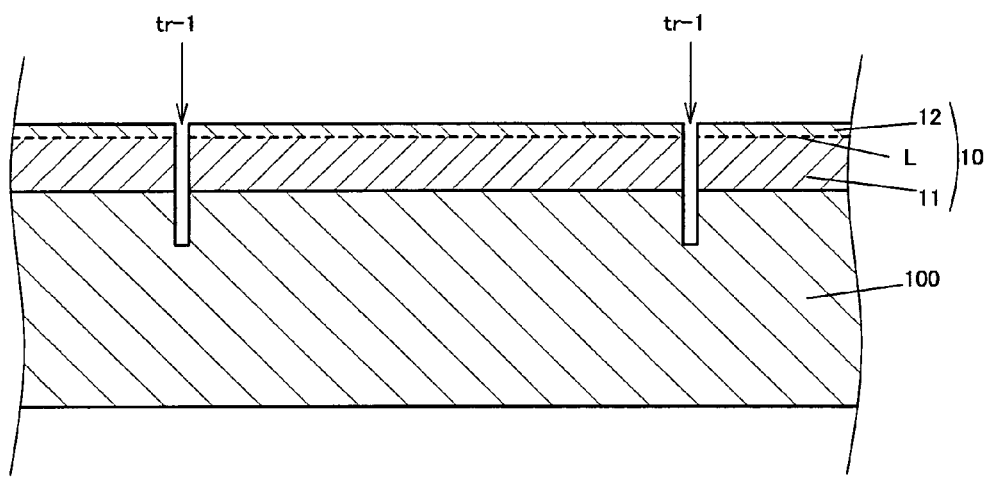
Figure 2C:
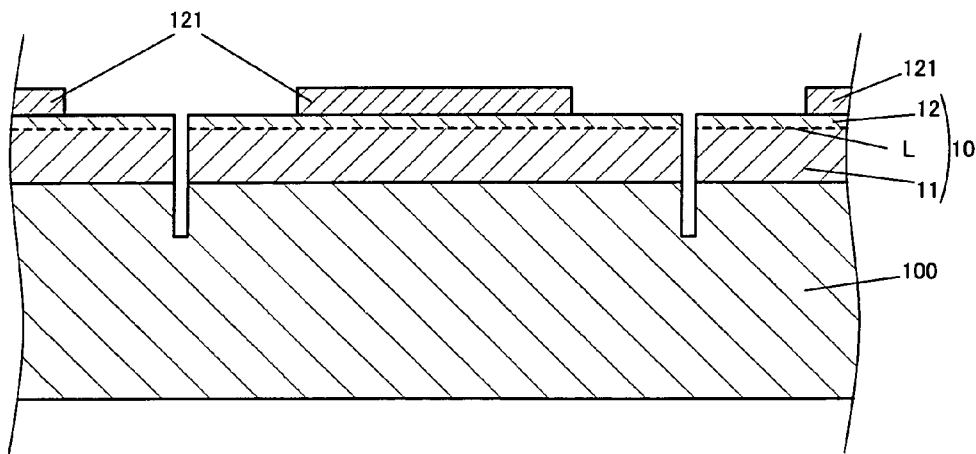
Figure 2D:
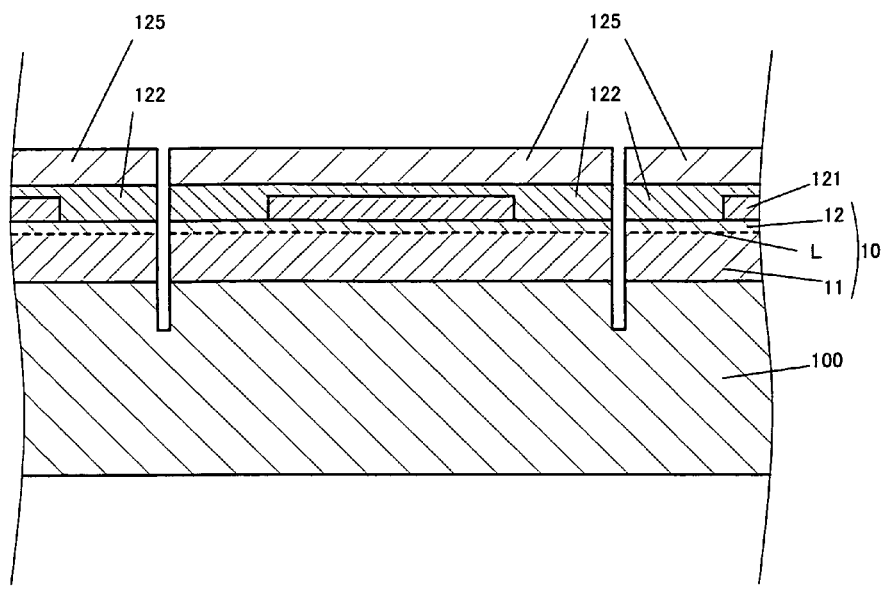
Figure 2E:
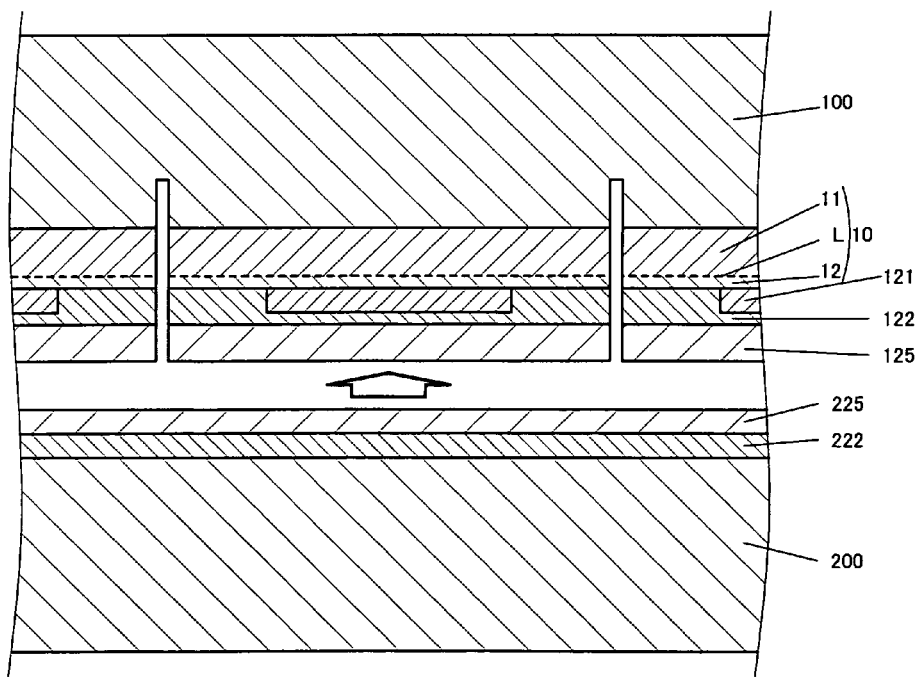
Figure 2F:
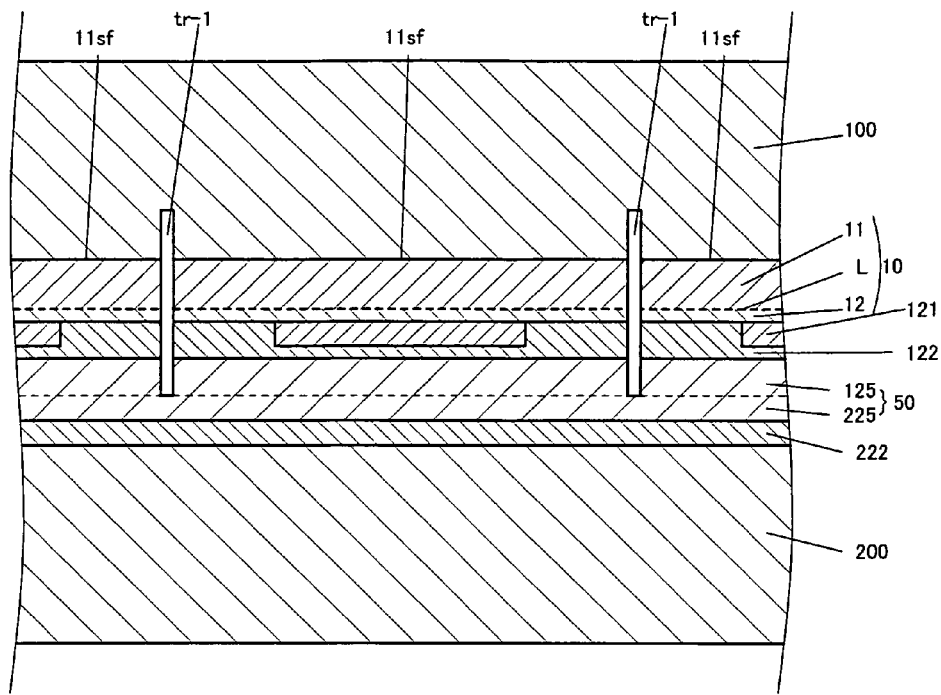
Figure 2G:
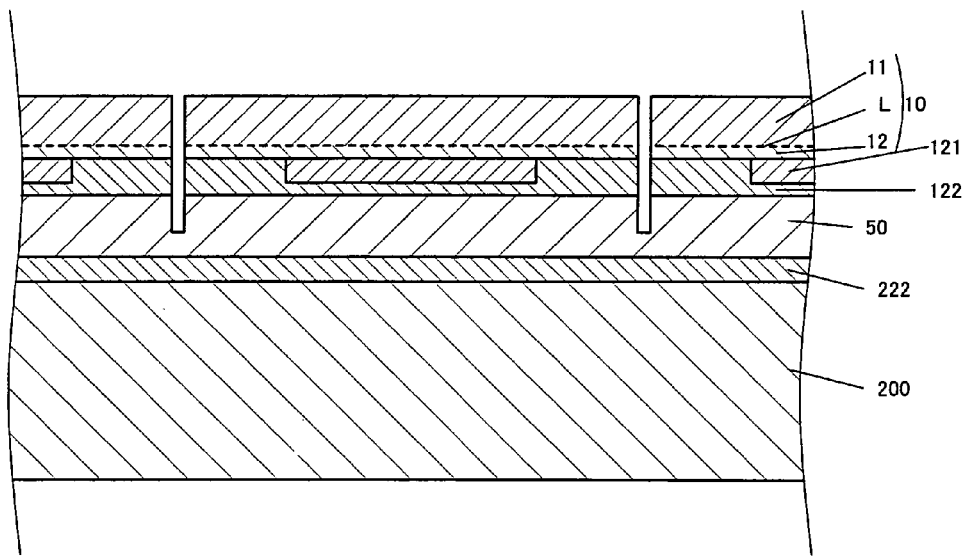

The Group III nitride-based compound semiconductor device (blue LED) 1000 shown in FIG. 1 was produced as follows. FIGS. 2A to 2P are sketches showing processes for producing the device 1000 (cross-sectional views).

An n-type layer 11 and a p-type layer 12 were epitaxially grown sequentially on an epitaxial growth substrate 100 made of sapphire (thickness: 500 μm), to thereby form an epitaxial layer 10 (FIG. 2A). A light-emitting region L was formed of an MQW structure, which is simply shown by a thick broken line in FIG. 2A.

Subsequently, first trenches tr-1, which serve as gas passages upon the laser lift-off process, were formed by means of a dicer. Each of the first trenches tr-1 was formed by removing a portion of the p-type layer 12 and the n-type layer 11 (total thickness: about 4 μm) and a portion of the epitaxial growth substrate 100 (depth: about 10 μm). The width of each of the first trenches tr-1 was regulated to about 20 μm (FIG. 2B).

Next, an Ag alloy layer was formed so as to cover the entire top surface of the epitaxial layer by means of a sputtering apparatus, and a resist mask was formed on the Ag alloy layer, followed by removal of unwanted portions of the Ag alloy layer. Thereafter, the resist mask was removed, and then alloying was carried out through heating, to thereby form a p-contact electrode 121 (FIG. 2C).

Subsequently, a Ti layer, a TiN layer, a Ti layer, an Ni layer, and an Au layer were sequentially formed on the entire top surface of the epitaxial layer by means of a sputtering apparatus. These five layers are collectively shown as a conductive layer 122. The TiN layer (i.e., compound layer) must be formed through a sputtering apparatus. However, the Ti layer, the Ni layer, or the Au layer, which is provided after formation of the TiN layer, may be formed through vapor deposition.

Then, an AuSu layer and an Au layer, serving as a solder layer 125, were formed on the entire surface of the conductive layer by means of a resistance heating deposition apparatus. The Au layer serves as a thin film for preventing oxidation of tin (Sn) (FIG. 2D).

The first trenches tr-1 may be coated with the conductive layer 122 and the solder layer 125, so long as the first trenches tr-1 are secured to communicate, as air passages, with the outside of the wafer, or the trenches can communicate with the outside of the wafer during laser irradiation upon the laser lift-off process. Indeed, the conductive layer 122 and the solder layer 125 may be thickly formed at the bottom portions of the first trenches tr-1. However, these layers are not formed on side surfaces of the first trenches tr-1, or are very thinly formed on the side surfaces. Specifically, an end portion of the interface between the n-type layer 11 and the epitaxial growth substrate 100, which portion is present on a side surface of each first trench tr-1, may be coated with the conductive layer 122 and the solder layer 125. However, the resultant coating layer has a small thickness. Therefore, nitrogen gas generated at the interface between the n-type layer 11 and the epitaxial growth substrate 100 by laser irradiation upon the laser lift-off process readily penetrates the thin coating layer, and thus the generated nitrogen gas is discharged through the first trenches tr-1. That is, even when the side surfaces of the first trenches tr-1 are coated with the conductive layer 122 and the solder layer 125, nitrogen gas generated upon the laser lift-off process readily penetrates the resultant coating layers and is readily discharged through the first trenches tr-1 to the outside of the wafer.

Thus, in Example 1, the first trenches tr-1 are formed so that the bottom surfaces of the trenches are provided in the epitaxial growth substrate 100, and the side surfaces of the trenches include exposed side surfaces of the epitaxial layer 10. However, the requirement for the first trenches tr-1 is not that the bottom surfaces of the trenches are provided in the epitaxial growth substrate 100 and the side surfaces of the trenches include exposed side surfaces of the epitaxial layer 10. The requirement for the first trenches tr-1 is that nitrogen gas generated at the interface 11sf between the n-type layer 11 and the epitaxial growth substrate 100 can be discharged through the first trenches tr-1 to the outside of the wafer. Therefore, the first trenches tr-1 will be hereinafter described by focusing not on the form of the trenches (each including a bottom surface and side surfaces), but on the effect of the trenches as gas passages. Thus, when the conductive layer 122 and the solder layer 125 are formed after formation of the first trenches tr-1, the side surfaces of the first trenches tr-1 may be thinly coated with these layers, so long as the resultant coating layer does not impede the effect of the first trenches tr-1 as gas passages for discharging nitrogen gas to the outside of the wafer after bonding of the solder layer to a support substrate 200. Although the depth of the first trenches tr-1 shown in FIG. 2D (or subsequent figures) after deposition of the conductive layer 122 and the solder layer 125 is greater than the depth of the first trenches tr-1 shown in FIG. 2B, these first trenches tr-1 having different depths will be referred to as "first trenches tr-1," since they have the same function as gas passages.

Subsequently, a conductive layer 222 including a Ti layer, an Ni layer, and an Au layer, and a solder layer 225 including an AuSu layer and an Au layer are sequentially formed on the entire top surface of a silicon support substrate 200 (thickness: 500 μm) by means of a resistance heating deposition apparatus. The Au layer serves as a thin film for preventing oxidation of tin (Sn).

Then, the epitaxial growth substrate 100 having thereon the epitaxial layer 10 is bonded to the support substrate 200 so that the solder layers 125 and 225 face each other. Each of the solder layers 125 and 225 serves as a low-melting-point alloy layer. Bonding was carried out at 320° C. and 196 kPa (about 2 atm., 2 kgf/cm$^2$) (FIG. 2E).

Thus, the two AuSn layers and the two Au thin layers provided between the AuSn layers are formed into a single AuSn layer. Hereinafter, a layer formed through integration of the solder layers 125 and 225 will be referred to as "solder layer 50" (FIG. 2F).

Subsequently, the laser lift-off process is carried out. A laser beam is applied to a region in the vicinity of the interface 11sf between the n-type layer 11 of the epitaxial layer and the sapphire epitaxial growth substrate 100, to thereby decompose a thin film portion. In this case, the laser irradiation region (shot area) was determined to be a square region (2 mm×2 mm) including 16 square chips provided at a pitch of 500 μm. Thus, as shown in FIG. 2F, a thin film portion in the vicinity of the interface 11sf between the n-type layer 11 and the sapphire epitaxial growth substrate 100 was completely decomposed, and the epitaxial growth substrate 100 was removed by releasing the bonding of the substrate 100 to the support substrate via the n-type layer 11 (FIG. 2G).

Since the first trenches tr-1 communicate with the outside of the wafer, even when nitrogen gas is generated, the thus-generated nitrogen gas is immediately discharged through the first trenches tr-1 to the outside of the wafer. Thus, laser irradiation imposes only a small load on the epitaxial layer 10, the epitaxial growth substrate 100, the support substrate 200, and the conductive layers provided therebetween. Finally, it was confirmed that neither exfoliation nor cracking occurred in the epitaxial layer 10, the epitaxial growth substrate 100, the support substrate 200, and the conductive layers provided therebetween.

As described above, the bottom surfaces of the first trenches tr-1 and a portion of the side surfaces thereof were provided in the sapphire substrate 100. Therefore, this process removed, together with the sapphire substrate 100, a portion (including the bottom surfaces and side surfaces) of the first trenches tr-1 which was provided in the sapphire substrate 100 and on which a portion of the conductive layer 122 and the solder layer 125 was provided.

Figure 2H:
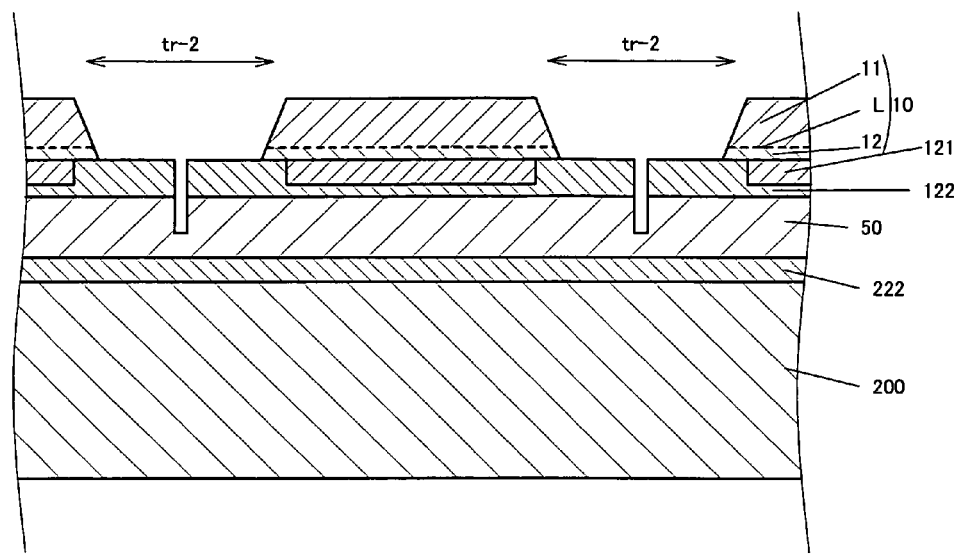

Subsequently, through dry etching by use of a mask, second trenches tr-2 were formed in the epitaxial layer 10 by removing regions corresponding to outer peripheral portions of a chip, each of the regions including a first trench tr-1 and having a width greater than that of the first trench tr-1 (FIG. 2H).

In this case, the etching mask employed was formed of SiO$_2$ through CVD so as to have a specific pattern. As described above, a portion of the side surfaces of the first trenches tr-1 was provided in the epitaxial layer 10 including the n-type layer 11 and the p-type layer 12. Therefore, the dry etching process removed, together with a portion of the epitaxial layer 10, a portion (including the side surfaces) of the first trenches tr-1 which was provided in the epitaxial layer 10 and on which a portion of the conductive layer 122 and the solder layer 125 was provided.

For comparison between the positions of the second trenches tr-2 and those of the first trenches tr-1, description is made by comparing FIG. 2H with FIG. 2G, which does not illustrate the sapphire epitaxial growth substrate 100 in which the bottom surfaces of the first trenches tr-1 were provided upon formation of the trenches. For the sake of convenience, the trenches shown in FIG. 2G are described as the first trenches tr-1 even after removal of the epitaxial growth substrate 100.

Figure 2I:
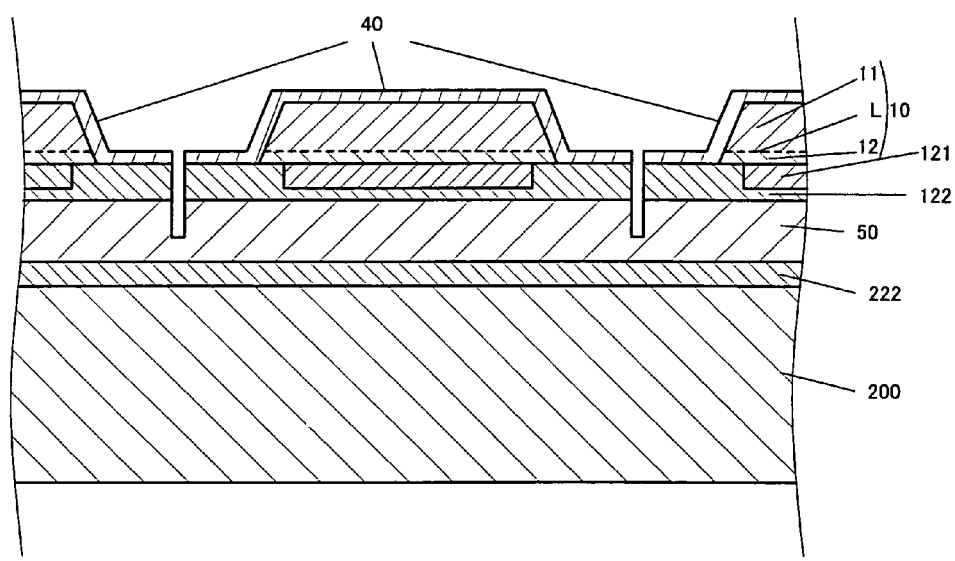

Subsequently, SiN$_x$ was deposited on the entire top surface of the wafer through CVD for forming an insulating protective film 40 (FIG. 2I). The SiNx insulating protective film 40 was also temporarily deposited on the bottom portions of the first trenches tr-1 provided in the solder layer 50.

Figure 2J:
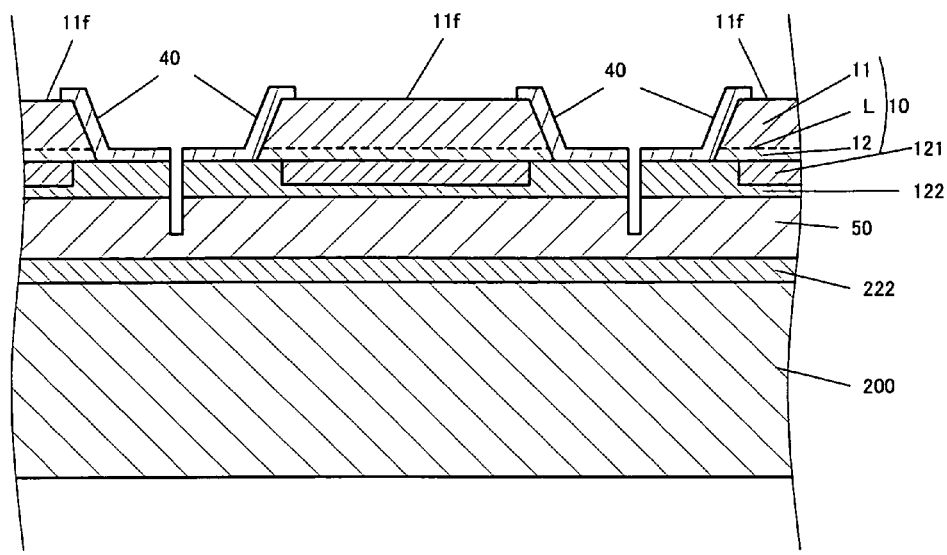

Thereafter, while a required portion of the SiNx insulating protective film 40 (i.e., a portion at the outer periphery of each device chip) was left, the other portion of the film 40 was removed through dry etching, to thereby expose a surface 11f of the n-type layer 11 (FIG. 2J). The surface 11f of the n-type layer 11 is an N-polar surface (or so-called (000-1) plane (-c-plane)) and is easily etched.

Figure 2K:
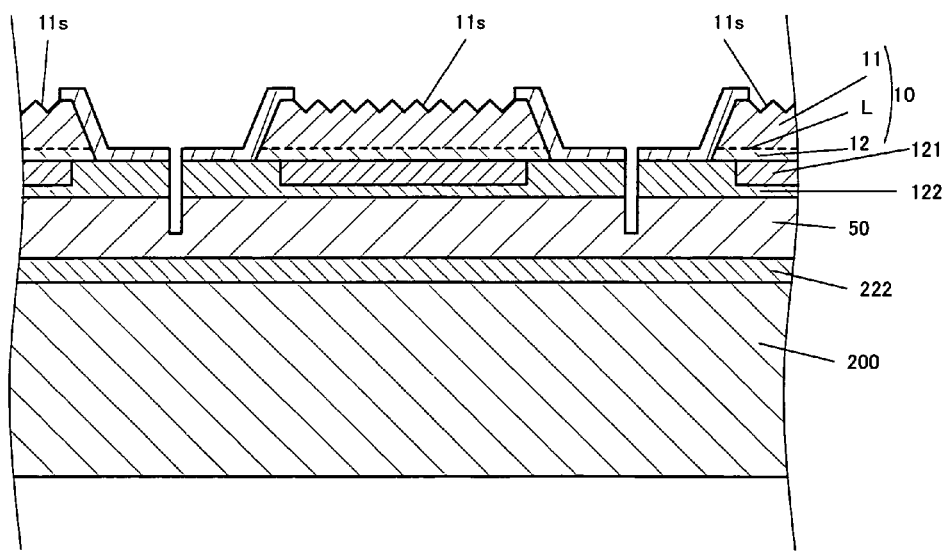

Then, the thus-exposed surface of the n-type layer 11 of the wafer was immersed in 1 mol/L (1M) aqueous potassium hydroxide solution (KOH aq) and allowed to stand at 60° C., to thereby form a micro embossment surface 11s (FIG. 2K).

Figure 2L:
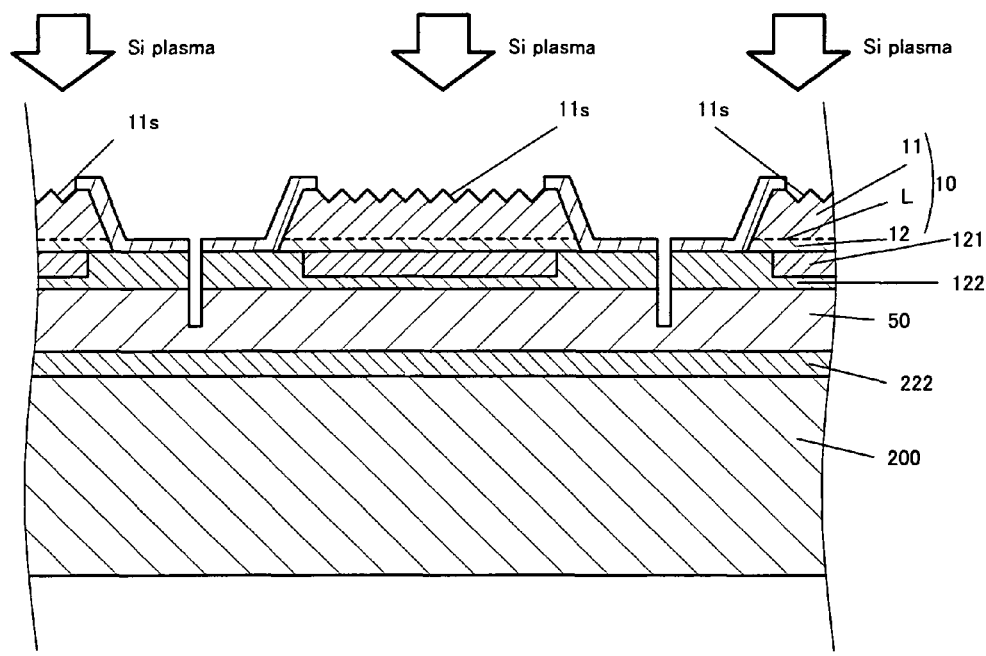

Subsequently, the micro embossment surface 11s of the n-type layer 11 was treated with a plasma of a silicon-containing compound gas, to thereby form a pseudo-silicon-heavily-doped layer (FIG. 2L). Thereafter, treatment with a fluoride-ion-containing chemical was not carried out. The plasma treatment process was performed under the following conditions.

SiCl$_4$ gas was employed as a plasma source and was fed at a flow rate of 30 sccm.

The pressure in the process chamber was regulated to 3 Pa.

The electric field in the process chamber was generated by an antenna electric power of 300 W and a high frequency of 13.56 MHz. Separately, a high-frequency bias electric power (300 W) was supplied to the support substrate 200 formed of p-type silicon.

The plasma treatment process was carried out for 60 seconds.

Figure 2M:
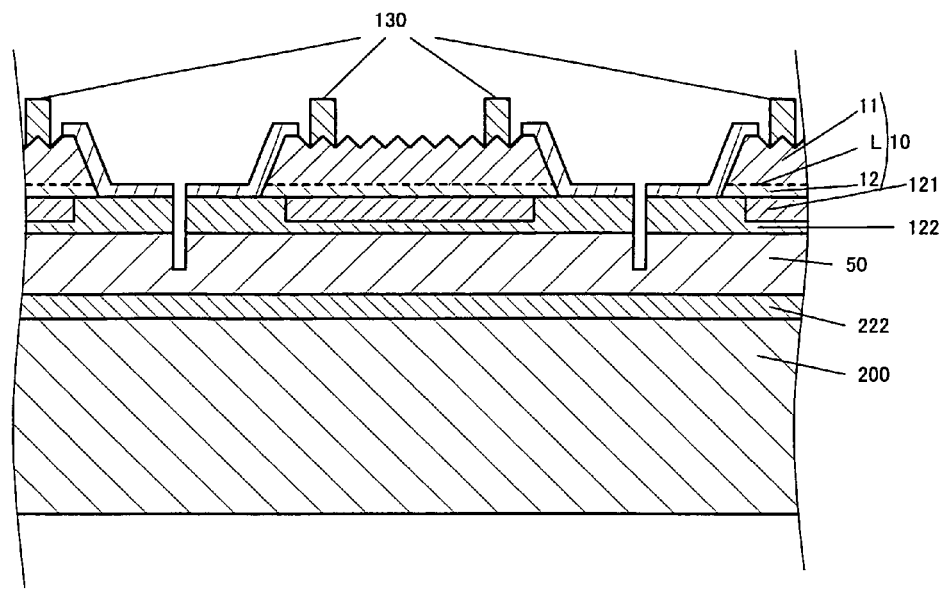

Subsequently, a vanadium (V) layer (100 nm) and a gold (Au) layer (500 nm) were stacked on a region of interest by use of a resist mask, to thereby form an n-electrode 130 (FIG. 2M). Thereafter, annealing was carried out at 320° C. for three minutes.

Figure 2N:
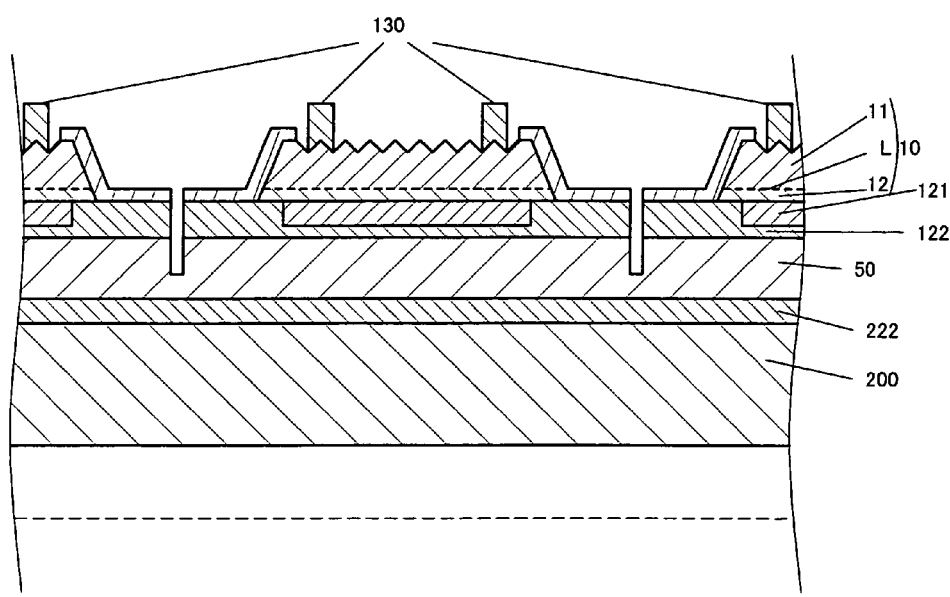

Next, the bottom surface of the silicon support substrate 200 was polished, to thereby reduce the thickness thereof to 120 μm (FIG. 2N).

Figure 2O:
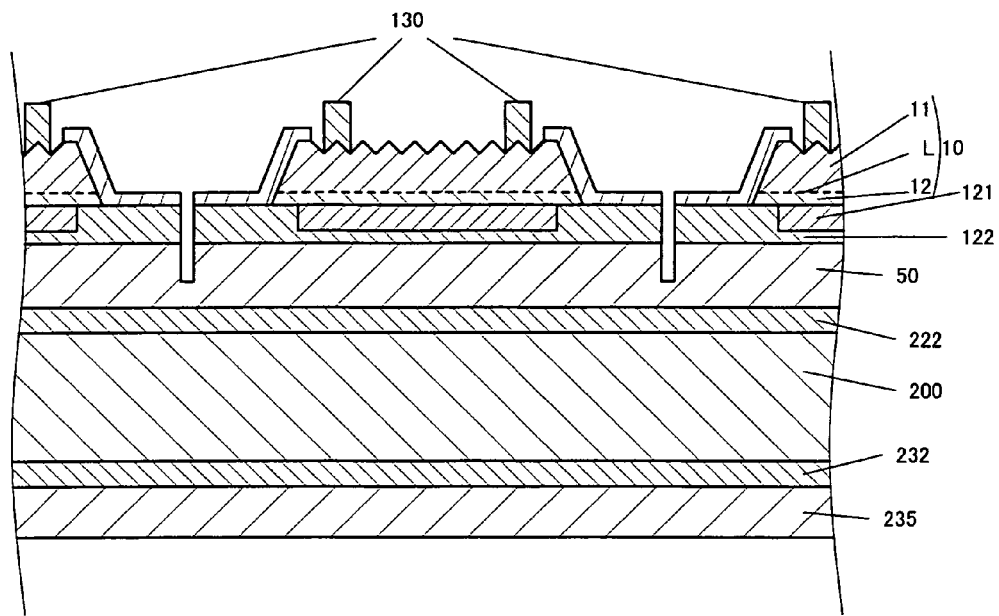
Figure 2P:
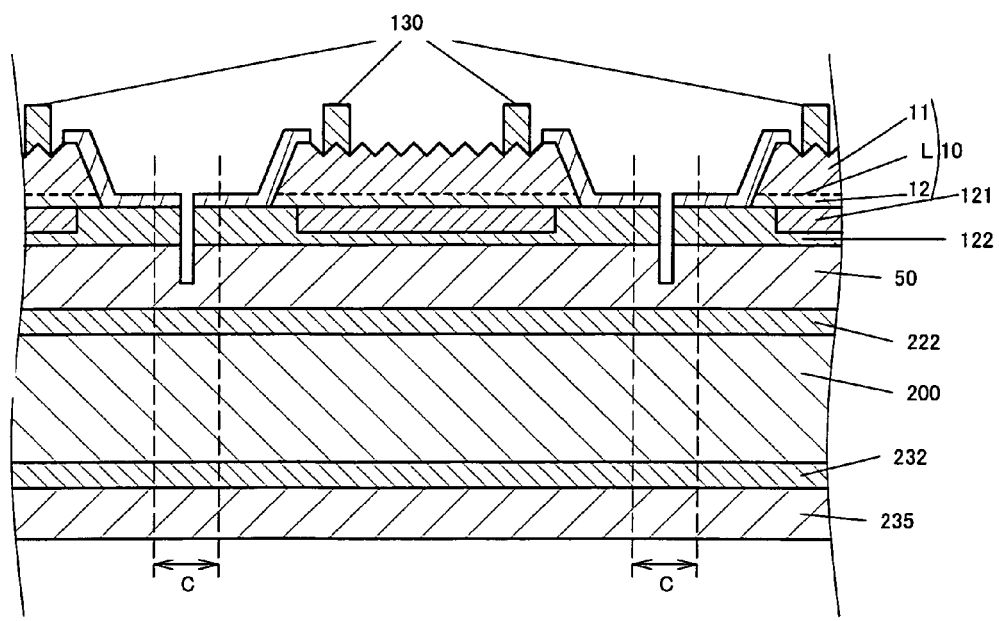

A conductive layer 232 including a Pt layer, a Ti layer, and an Au layer, and a solder layer 235 including an AuSn layer and an Au layer were deposited on the polished surface of the silicon support substrate 200 (FIG. 2O). The Au layer serves as a thin film for preventing oxidation of tin (Sn). Formation of the solder layer 235 may be omitted.

Then, the support substrate 200 was cut by means of a laser (FIG. 2P). As shown in FIG. 2P, a region between two broken lines denoted by "C" was decomposed and melted by means of a laser, and the wafer was separated into device chips. Thus, the Group III nitride-based compound semiconductor device (blue LED) 1000 shown in FIG. 1 was produced.

There were evaluated V-I characteristics between two n-electrodes 130 formed on a single chip of the Group III nitride-based compound semiconductor device (blue LED) 1000. Each of the two n-electrodes 130 was a dot electrode having a size (as viewed from above) of 100 μm×100 μm, and the pitch of the electrodes (i.e., the distance between the centers of the electrodes) was 300 μm.

Figure 3:
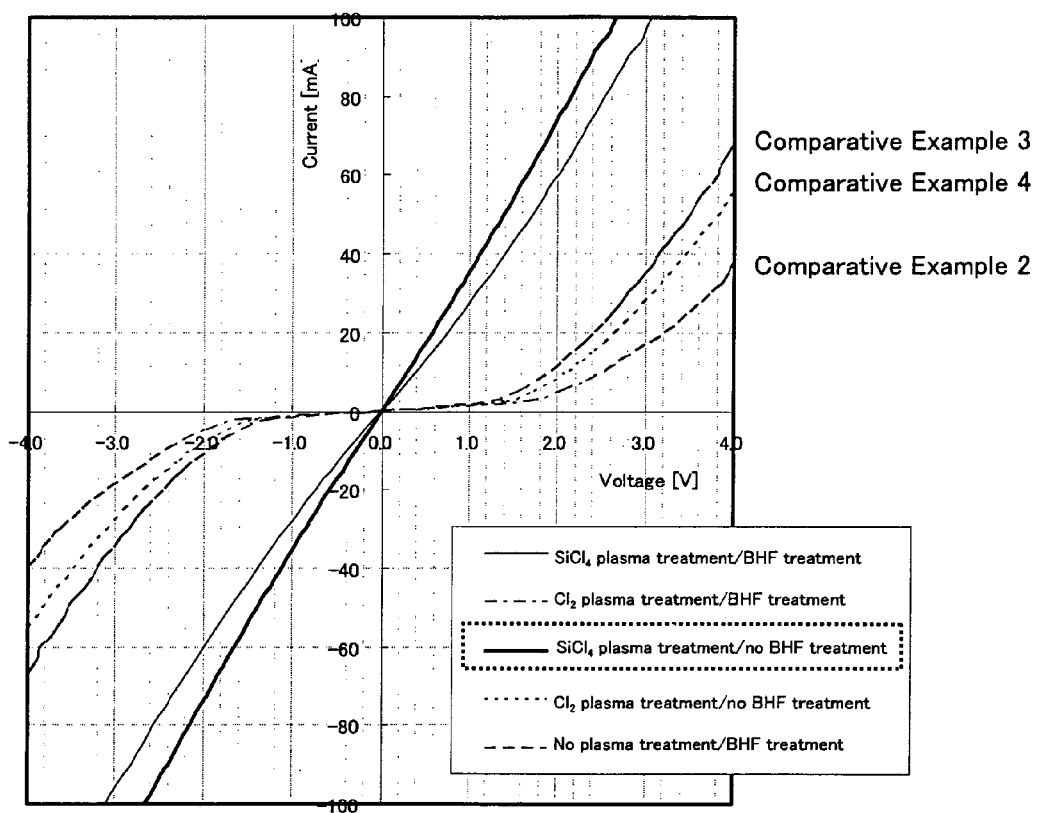
FIG. 3 is a graph showing V-I characteristics between two dot n-electrodes in each of five different devices.

The results are shown in FIG. 3. Among the five graph profiles shown in FIG. 3, the graph profile denoted by "Example 1" corresponds to the V-I characteristics between the two n-electrodes 130 of the Group III nitride-based compound semiconductor device (blue LED) 1000 produced in Example 1.

As shown in FIG. 3, the V-I characteristics exhibited ohmic behavior, and sufficiently low resistance was attained.

Comparative Examples Shown in FIG. 3

For comparison, in Comparative Examples, Group III nitride-based compound semiconductor devices (blue LEDs) were produced in the same manner as in Example 1, except that a process before formation of an n-electrode 130 (including treatment with a plasma of a silicon-containing compound gas) was carried out as follows. Subsequently, there were evaluated V-I characteristics between two n-electrodes 130 formed on a single chip of each of the thus-produced devices.

Comparative Example 1

In Comparative Example 1, after treatment with a plasma of an Si-containing compound gas (pseudo-Si-heavy-doping) shown in FIG. 2L, the wafer was immersed in buffered hydrofluoric acid (BHF) for one minute before formation of an n-electrode 130 shown in FIG. 2M.

As shown in the graph profile denoted by "Comparative Example 1" in FIG. 3, a relatively low ohmic resistance was attained, but the ohmic resistance was greater than that in the case of Example 1. Thus, resistance was increased by carrying out the hydrofluoric acid treatment before formation of the n-electrode 130. This phenomenon is considered to be attributed to the fact that no small amount of Si is removed from the pseudo silicon-heavily-doped layer through the hydrofluoric acid treatment, and contact resistance increases between the vanadium contact electrode and the n-type layer.

Comparative Example 2

In Comparative Example 2, after formation of a micro embossment surface 11s shown in FIG. 2K, without treatment with a plasma of an Si-containing compound gas (pseudo-Si-heavy-doping) shown in FIG. 2L, the wafer was immersed in buffered hydrofluoric acid (BHF) for one minute before formation of an n-electrode 130 shown in FIG. 2M.

As shown in the graph profile denoted by "Comparative Example 2" in FIG. 3, ohmic contact was not obtained, and resistance was high. Comparison between Comparative Example 2 and Example 1 or Comparative Example 1 indicates the effect of pseudo-Si-heavy-doping. These data indicate that pseudo-Si-heavy-doping realizes ohmic contact between the vanadium contact electrode and the micro embossment surface 11s (i.e., N-polar surface) of the n-type layer 11.

Comparative Example 3

In Comparative Example 3, after formation of a micro embossment surface 11s shown in FIG. 2K, a plasma treatment process was carried out by use of chlorine ($Cl_2$) as described below, and then the wafer was immersed in BHF for one minute, followed by formation of an n-electrode 130 shown in FIG. 2M and subsequent processes.

The chlorine ($Cl_2$) plasma treatment process was carried out under the following conditions.

$Cl_2$ gas was employed as a plasma source and was fed at a flow rate of 30 sccm.

The pressure in the process chamber was regulated to 2 Pa.

The electric field in the process chamber was generated by a high-frequency antenna electric power of 300 W. Separately, a high-frequency bias electric power (30 W) was supplied to a support substrate 200 formed of p-type silicon.

The plasma treatment process was carried out for 120 seconds.

As shown in the graph profile denoted by "Comparative Example 3" in FIG. 3, ohmic contact was not obtained, and resistance was relatively high.

Comparison between Comparative Example 3 (in which Cl plasma treatment was performed) and Example 1 or Comparative Example 1 indicates that the effect of Cl plasma treatment is completely different from that of treatment with a plasma of an Si-containing compound gas. Specifically, in the case of Cl plasma treatment, ohmic contact is not obtained between the n-type layer and the vanadium contact electrode annealed at 320° C., whereas in the case of treatment with a plasma of an Si-containing compound gas, ohmic contact is obtained between the n-type layer and the vanadium contact electrode annealed at 320° C.

Comparative Example 4

In Comparative Example 4, after formation of a micro embossment surface 11s shown in FIG. 2K, Cl plasma treatment was performed under the same conditions as in Comparative Example 3, and then formation of an n-electrode 130 shown in FIG. 2M and subsequent processes were carried out without performing BHF treatment.

As shown in the graph profile denoted by "Comparative Example 4" in FIG. 3, ohmic contact was not obtained, and resistance was higher than that in the case of Comparative Example 3.

Comparison between Comparative Example 4 (in which Cl plasma treatment was performed) and Example 1 or Comparative Example 1 also indicates that the effect of Cl plasma treatment is completely different from that of treatment with a plasma of an Si-containing compound gas. Specifically, in the case of Cl plasma treatment, ohmic contact is not obtained between the n-type layer and the vanadium contact electrode annealed at 320° C., whereas in the case of treatment with a plasma of an Si-containing compound gas, ohmic contact is obtained between the n-type layer and the vanadium contact electrode annealed at 320° C.

The findings from the five graph profiles shown in FIG. 3 are summarized as follows.

Next will be described the results regarding whether or not ohmic contact was obtained between the vanadium contact electrode annealed at 320° C. and the micro embossment surface 11s (i.e., N-polar surface) of the n-type layer 11.

Ohmic contact was obtained through treatment with a plasma of an Si-containing compound gas (Example 1 or Comparative Example 1). In contrast, ohmic contact was not obtained in the case of no plasma treatment (Comparative Example 2) or Cl plasma treatment (Comparative Example 3 or 4).

When treatment with a fluoride-ion-containing chemical was not performed after treatment with a plasma of an Si-containing compound gas (Example 1), low resistance was attained, as compared with the case where treatment with a fluoride-ion-containing chemical was performed (Comparative Example 1).

Example 2

The procedure of Example 1 was repeated, except that vanadium was replaced with chromium for formation of a contact electrode on the surface (N-polar surface) of the n-type layer, to thereby produce a Group III nitride-based compound semiconductor device (blue LED) including an n-electrode having a chromium/gold layered structure.

There were evaluated V-I characteristics between two chromium/gold n-electrodes 130 formed on a single chip of the Group III nitride-based compound semiconductor device (blue LED) produced in Example 2. Each of the two n-electrodes 130 was a dot electrode having a size (as viewed from above) of 100 μm×100 μm, and the pitch of the electrodes (i.e., the distance between the centers of the electrodes) was 300 μm.

Figure 4:
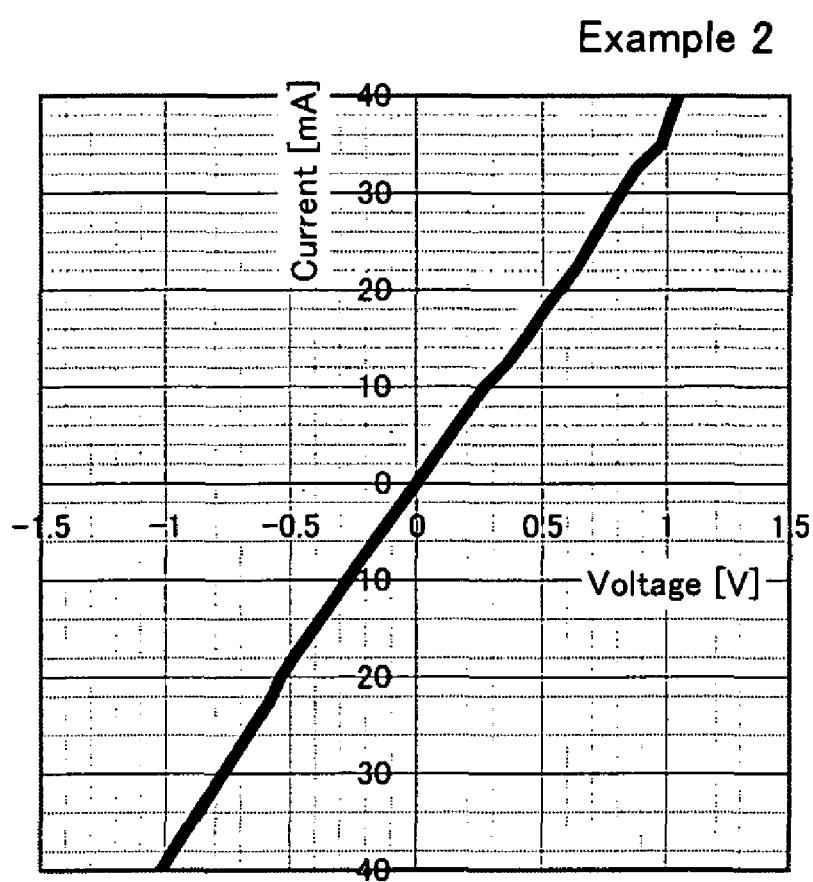
FIG. 4 is a graph showing V-I characteristics between two dot n-electrodes in the device of Example 2.

The results are shown in FIG. 4. In FIG. 4, the graph profile denoted by "Example 2" corresponds to the V-I characteristics between the two chromium/gold n-electrodes of the Group III nitride-based compound semiconductor device (blue LED) produced in Example 2.

As shown in FIG. 4, the V-I characteristics exhibited ohmic behavior, and sufficiently low resistance was attained. In Example 2 (employing chromium/gold n-electrodes), contact resistance was approximately equal to that in the case of Example 1 (employing vanadium/gold n-electrodes). However, the light extraction performance of the Group III nitride-based compound semiconductor device (blue LED) of Example 2 was increased by a little less than 10%. An increase in light extraction performance is considered to be attributed to the fact that the blue light reflectance of chromium provided on the n-type layer 11 in Example 2 was higher than that of vanadium provided in the n-type layer 11 in Example 1.

Example 3

The procedure of Example 1 was repeated, except that vanadium was replaced with tungsten for formation of a contact electrode on the surface (N-polar surface) of the n-type layer, to thereby produce a Group III nitride-based compound semiconductor device (blue LED) including an n-electrode having a tungsten/gold layered structure.

There were evaluated V-I characteristics between two tungsten/gold n-electrodes 130 formed on a single chip of the Group III nitride-based compound semiconductor device (blue LED) produced in Example 3. Each of the two n-electrodes 130 was a dot electrode having a size (as viewed from above) of 100 μm×100 μm, and the pitch of the electrodes (i.e., the distance between the centers of the electrodes) was 300 μm.

Figure 5:
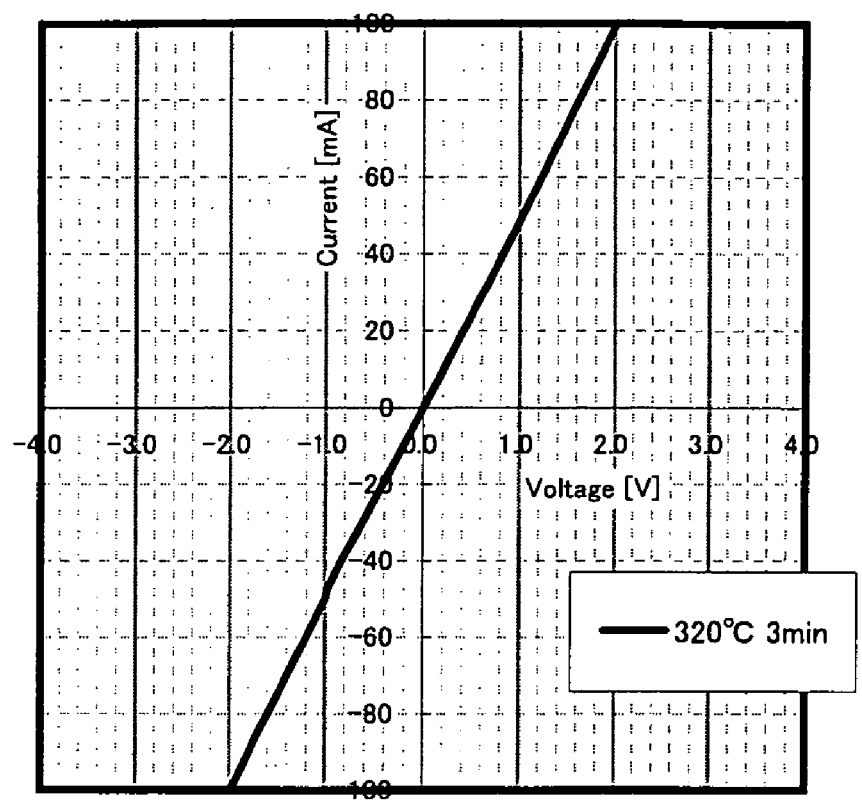
FIG. 5 is a graph showing V-I characteristics between two dot n-electrodes in the device of Example 3.

The results are shown in FIG. 5. In FIG. 5, the graph profile denoted by "Example 3" corresponds to the V-I characteristics between the two tungsten/gold n-electrodes of the Group III nitride-based compound semiconductor device (blue LED) produced in Example 3.

As shown in FIG. 5, the V-I characteristics exhibited ohmic behavior, and sufficiently low resistance was attained.

In the aforementioned Examples, vanadium, chromium, or tungsten was employed for forming a contact electrode. However, even when nickel, platinum, niobium, or iron was employed, similar results were obtained.

Specifically, in the case where, in the Group III nitride-based compound semiconductor device of the present invention produced by the laser lift-off process, a contact electrode, comprising at least one selected from a group consisting of vanadium, chromium, tungsten, nickel, platinum, niobium, and iron, was formed, through annealing at 350° C. or lower, on the surface (N-polar surface) of the n-type layer, when a pseudo-silicon-heavily-doped layer was formed on the surface (N-polar surface) of the n-type layer through treatment with a plasma of a silicon-containing compound gas, and treatment with a fluoride-ion-containing chemical was not carried out, ohmic contact was obtained, and low resistance was attained.

Thus, the effects of the present invention were confirmed.

What is claimed is:

1. A method for producing a Group III nitride-based compound semiconductor light-emitting device, the method comprising:
    a layer stacking step of forming an n-type layer, a light-emitting layer or an active layer, and a p-type layer sequentially on an epitaxial growth substrate formed of a hetero-substrate;
    a bonding step of forming a conductive layer on a surface of the p-type layer, to thereby bond the p-type layer to a conductive support substrate;
    a growth substrate removal step of removing the epitaxial growth substrate by decomposing at least a portion of the n-type layer through laser irradiation; and
    a pretreatment and electrode formation step of forming an electrode on the exposed n-type layer, wherein the pretreatment and electrode formation step comprises:
    a plasma silicon doping step of doping a surface of the n-type layer with silicon by applying, to the n-type layer surface, a plasma of a silicon-containing compound formed through application of a high-frequency electric power to the conductive substrate;
    a contact electrode formation step of forming, on the n-type layer surface, a contact electrode comprising at least one selected from a group consisting of vanadium, chromium, tungsten, nickel, platinum, niobium, and iron; and
    an alloying step of alloying the n-type layer and the contact electrode through thermal treatment at 100° C. to 350° C.

2. A method for producing a Group III nitride-based compound semiconductor light-emitting device according to claim 1, wherein treatment with a solution of a fluorine-containing compound is not carried out between the plasma silicon doping step and the contact electrode formation step.

3. A method for producing a Group III nitride-based compound semiconductor light-emitting device according to claim 2, which further comprises an embossment formation step of forming an embossment on a surface of the exposed n-type layer before the pretreatment and electrode formation step.

4. A method for producing a Group III nitride-based compound semiconductor light-emitting device according to claim 1, which further comprises an embossment formation step of forming an embossment on a surface of the exposed n-type layer before the pretreatment and electrode formation step.

5. A method for producing a Group III nitride-based compound semiconductor light-emitting device, the method comprising:
    a layer stacking step of forming an undoped layer, n-type layer, a light-emitting layer or an active layer, and a p-type layer sequentially on an epitaxial growth substrate formed of a hetero-substrate;
    a bonding step of forming a conductive layer on a surface of the p-type layer, to thereby bond the p-type layer to a conductive support substrate;
    a growth substrate removal step of removing the epitaxial growth substrate by decomposing at least a portion of the undoped layer through laser irradiation;
    an undoped layer removal step of removing the undoped layer, to thereby expose the n-type layer; and a pretreatment and electrode formation step of forming an electrode on the thus-exposed n-type layer, wherein the pretreatment and electrode formation step comprises:

a plasma silicon doping step of doping a surface of the n-type layer with silicon by applying, to the n-type layer surface, a plasma of a silicon-containing compound formed through application of a high-frequency electric power to the conductive substrate;

a contact electrode formation step of forming, on the n-type layer surface, a contact electrode comprising at least one selected from a group consisting of vanadium, chromium, tungsten, nickel, platinum, niobium, and iron; and an alloying step of alloying the n-type layer and the contact electrode through thermal treatment at 100° C. to 350° C.

6. A method for producing a Group III nitride-based compound semiconductor light-emitting device according to claim 5, wherein treatment with a solution of a fluorine-containing compound is not carried out between the plasma silicon doping step and the contact electrode formation step.

7. A method for producing a Group III nitride-based compound semiconductor light-emitting device according to claim 6, which further comprises an embossment formation step of forming an embossment on a surface of the exposed n-type layer before the pretreatment and electrode formation step.

8. A method for producing a Group III nitride-based compound semiconductor light-emitting device according to claim 5, which further comprises an embossment formation step of forming an embossment on a surface of the exposed n-type layer before the pretreatment and electrode formation step.

* * * * *